(12) United States Patent
Chi et al.

(10) Patent No.: US 10,276,390 B2
(45) Date of Patent: Apr. 30, 2019

(54) METHOD AND APPARATUS FOR REDUCING THRESHOLD VOLTAGE MISMATCH IN AN INTEGRATED CIRCUIT

(71) Applicant: GLOBALFOUNDRIES Inc., Grand Cayman (KY)

(72) Inventors: Min-hwa Chi, San Jose, CA (US); Meixiong Zhao, Ballston Lake, NY (US); Kuniko Kikuta, Machida (JP)

(73) Assignee: GLOBALFOUNDRIES Inc., Grand Cayman (KY)

( * ) Notice: Subject to any disclaimer, the term of this patent is extended or adjusted under 35 U.S.C. 154(b) by 415 days.

(21) Appl. No.: 15/097,861

(22) Filed: Apr. 13, 2016

(65) Prior Publication Data

US 2017/0301544 A1    Oct. 19, 2017

(51) Int. Cl.
| | |
|---|---|
| H01L 21/28 | (2006.01) |
| H01L 29/66 | (2006.01) |
| H01L 29/08 | (2006.01) |
| H01L 21/02 | (2006.01) |
| H01L 29/49 | (2006.01) |
| H01L 29/40 | (2006.01) |

(52) U.S. Cl.
CPC .. *H01L 21/28088* (2013.01); *H01L 21/02656* (2013.01); *H01L 21/28114* (2013.01); *H01L 29/0847* (2013.01); *H01L 29/401* (2013.01); *H01L 29/4983* (2013.01); *H01L 29/66545* (2013.01); *H01L 29/66795* (2013.01)

(58) Field of Classification Search
CPC ..................................................... H01L 21/28
See application file for complete search history.

(56) References Cited

U.S. PATENT DOCUMENTS

| 7,745,887 B2 | 6/2010 | Kim et al. |
| 2008/0067589 A1 | 3/2008 | Ito et al. |

*Primary Examiner* — Marvin Payen
(74) *Attorney, Agent, or Firm* — Heslin Rothenberg Farley & Mesiti P.C.; Stephen Scuderi

(57) ABSTRACT

A method of making a transistor for an integrated circuit includes providing a substrate and forming a dummy gate for the transistor within a gate trench on the substrate. The gate trench includes sidewalls, a trench bottom, and a trench centerline extending normally from a center portion of the trench bottom. The dummy gate is removed from the gate trench. A gate dielectric layer is disposed within the gate trench. A gate work-function metal layer is disposed over the gate dielectric layer, the work-function metal layer including a pair of corner regions proximate the trench bottom. An angled implantation process is utilized to implant a work-function tuning species into the corner regions at a tilt angle relative to the trench centerline, the tilt angle being greater than zero.

16 Claims, 8 Drawing Sheets

METHOD AND APPARATUS FOR REDUCING THRESHOLD VOLTAGE MISMATCH IN AN INTEGRATED CIRCUIT

TECHNICAL FIELD

The present invention relates to semiconductor integrated circuits. More specifically, the invention relates to reducing threshold voltage mismatch between field effect transistors of a semiconductor integrated circuit.

BACKGROUND

Threshold voltage (Vt) of a field effect transistor (FET) is the minimum gate-to-source voltage differential that is required to create a conducting path through the channel, and between the source and drain (S/D) terminals or regions of the FET. The Vt of devices within a semiconductor integrated circuit is one of the critical parameters that must be carefully controlled and matched from transistor to transistor for proper commercially reproducible operation. This is the case for such FET technologies as planar complementary metal-oxide semiconductor (CMOS) FETs or Fin-FETs, either of which may be manufactured on bulk semiconductor substrates or silicon-on-insulator (SOI) substrates.

The degree to which Vt will vary between adjacent transistors is known as Vt mismatch (Vtmm). With constant down-scaling of ultra-high density integrated circuits, the threshold for acceptable Vtmm is also scaled down. Therefore Vtmm becomes increasingly problematic for lower scale semiconductor technology class sizes, such as the 14 nanometers (nm) node and beyond. This is particularly the case in technologies, such as static random access memory (SRAM) technology, where transistor pairs have to be closely matched for proper operation.

Two major contributors to Vtmm in a FET are the geometry of the FET's gate stack (e,g, the critical dimensions, or gate work-function metal layer thickness) and the degree of random diffusion of dopants in the FET's channel. With regards to a FET's gate stack geometry and structure, an ideal gate stack would have a perfectly square geometry, vertical profile, and a perfectly uniform thickness of layers in the gate stack with its bottom layer being a perfectly uniformly thick high-k gate dielectric layer. The high-k dielectric layer, in turn, would be disposed flat against the FET's channel. However, this is hard to consistently achieve from device to device, especially at smaller critical dimensions (CD), wherein most gate stacks will tend to have bottom corner regions that are variously rounded from device to device. Additionally, the gate stacks of smaller CD devices tend to be variously thicker in the rounded corner regions than in the middle portions of the gate stacks. As a result, the well-known effective work function of the gate stacks (i.e., the gate dielectric layer, the gate work-function metal layer, and other gate electrode layers) of scaled devices will tend to vary across the channel regions of such devices. Because the effective work function of a device directly affects that device's Vt, than the more the effective work function varies between devices in an integrated circuit, the greater the Vtmm between those adjacent devices will be.

This is particularly the case with replacement metal gate (RMG) transistor technologies, wherein a metal gate stack (which generally includes a gate work-function metal layer and a gate electrode metal disposed over a gate dielectric layer) is used to replace a polysilicon dummy gate. More particularly, this is especially problematic with RMG FETs having titanium nitride (TiN) as a gate work-function metal layer.

With regards to the amount of random diffusion of dopants in a FET's channel, a major contributor to such random diffusion of dopants is the excessive use of annealing processes, such as rapid thermal annealing (RTA), during device formation. Other major contributors to random dopant diffusion into a FET's channel include dopant implantation within the S/D regions, lightly doped drain (LDD) implants within the channel and Halo (or pocket) implants within the channel.

However, each of the above listed features that contribute to increased diffusion of dopants into the channel are utilized to address specific problems or provide specific benefits, during the formation of a FET, making those features difficult to eliminate or replace. For example, S/D dopant implantation is often required to enhance conductivity between the source and drain terminals when a FET is in the on-state. Moreover, annealing is often required to repair damage caused by ion bombardment during dopant implantation, especially in the S/D regions. Additionally, LDD implants are used to suppress short channel effects (SCEs) such as hot carrier injection, drain induced barrier lowering or the like, which become more prevalent at scaled devices. Also, Halo implants are used to reduce punch-through leakage current between source and drain, which become increasingly problematic at lower class sizes.

Accordingly, there is a need for a method and apparatus to minimize Vtmm in transistors of an integrated circuit that can be applied to such technologies as CMOS FET and finFET on either bulk or SOI substrates. In particular, there is a need to minimize Vtmm for such technologies as SRAM, where transistor pair matching is critical.

Moreover, there is a need to minimize Vtmm even if the gate stack includes rounded corners that vary from the ideal square geometry. In particular there is need to minimize Vtmm in RMG transistors having variously rounded corners in their gate stack.

Additionally, there is a need to minimize Vtmm by reducing or eliminating such formation processes as annealing and/or S/D dopant implantation while still maintaining robust source to drain conductivity when the FET is in an on-state. Further there is a need to minimize Vtmm by eliminating LDD implants while still suppressing SCEs. Also there is a need to minimize Vtmm by eliminating Halo implants while still suppressing source to drain punch-through leakage current.

BRIEF DESCRIPTION

The present invention offers advantages and alternatives over the prior art by providing a transistor on a substrate structure and method of making the same. The transistor includes a work-function metal layer with corner regions that have a work-function tuning species implanted therein via an angled implantation process. The work-function tuning species tune the effective work function of the gate stack to be relatively uniform across the length of the transistor's channel. As a result, Vt of the transistor is more closely controlled, SCEs are minimized and the need for halo implants are eliminated, thus reducing Vtmm between the transistor and other devices associated with the structure.

Additionally, the transistor includes epitaxially grown source and drain (S/D) regions wherein n-type or p-type dopants are introduced entirely in-situ, thus avoiding any dopant implantation process during epitaxial growth of the S/D regions. As a result, random diffusion of dopant ions into the channel are minimized to further control Vt of the transistor and the need for LDD implants are eliminated, thus further reducing Vtmm between the transistor and other devices associated with the structure.

A method of making a transistor in accordance with one or more aspects of the present invention includes providing a substrate and forming a dummy gate for the transistor within a gate trench on the substrate. The gate trench includes sidewalls, a trench bottom, and a trench centerline extending normally from a center portion of the trench bottom. The dummy gate is removed from the gate trench. A gate dielectric layer is disposed within the gate trench. A gate work-function metal layer is disposed over the gate dielectric layer, the work-function metal layer includes a pair of corner regions proximate the trench bottom. An angled implantation process is utilized to implant a work-function tuning species into the corner regions at a tilt angle relative to the trench centerline, the tilt angle being greater than zero.

In another aspect of the invention, a method of making a transistor includes providing a substrate. Exposed portions of the substrate are etched to form boundaries of a source region and a drain region for a transistor, the source and drain (S/D) regions being connected by a channel disposed within the substrate. The S/D regions are epitaxially grown from precursors. One of an n-type dopant and a p-type dopant is introduced entirely in-situ during the epitaxial growth of the S/D regions.

A transistor for an integrated circuit in accordance with one or more aspects of the present invention includes a source region, a drain region and a channel disposed within a substrate. The source region and drain region are connected therebetween by the channel. A gate structure is disposed over the channel and is operative to control electrical conductivity through the channel from the source region to the drain region. The gate structure includes a gate trench having gate spacers as sidewalls and a gate bottom as a top surface of the channel. The gate structure also includes a gate dielectric layer disposed within the gate trench. The gate structure further includes a gate work-function metal layer disposed on the gate dielectric layer, the work-function metal layer including corner regions proximate the trench bottom and a middle region between the corner regions. The corner regions have a work-function tuning species implanted therein which tunes an effective work function of the corner regions to be closer in value to an effective work function of the middle region.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
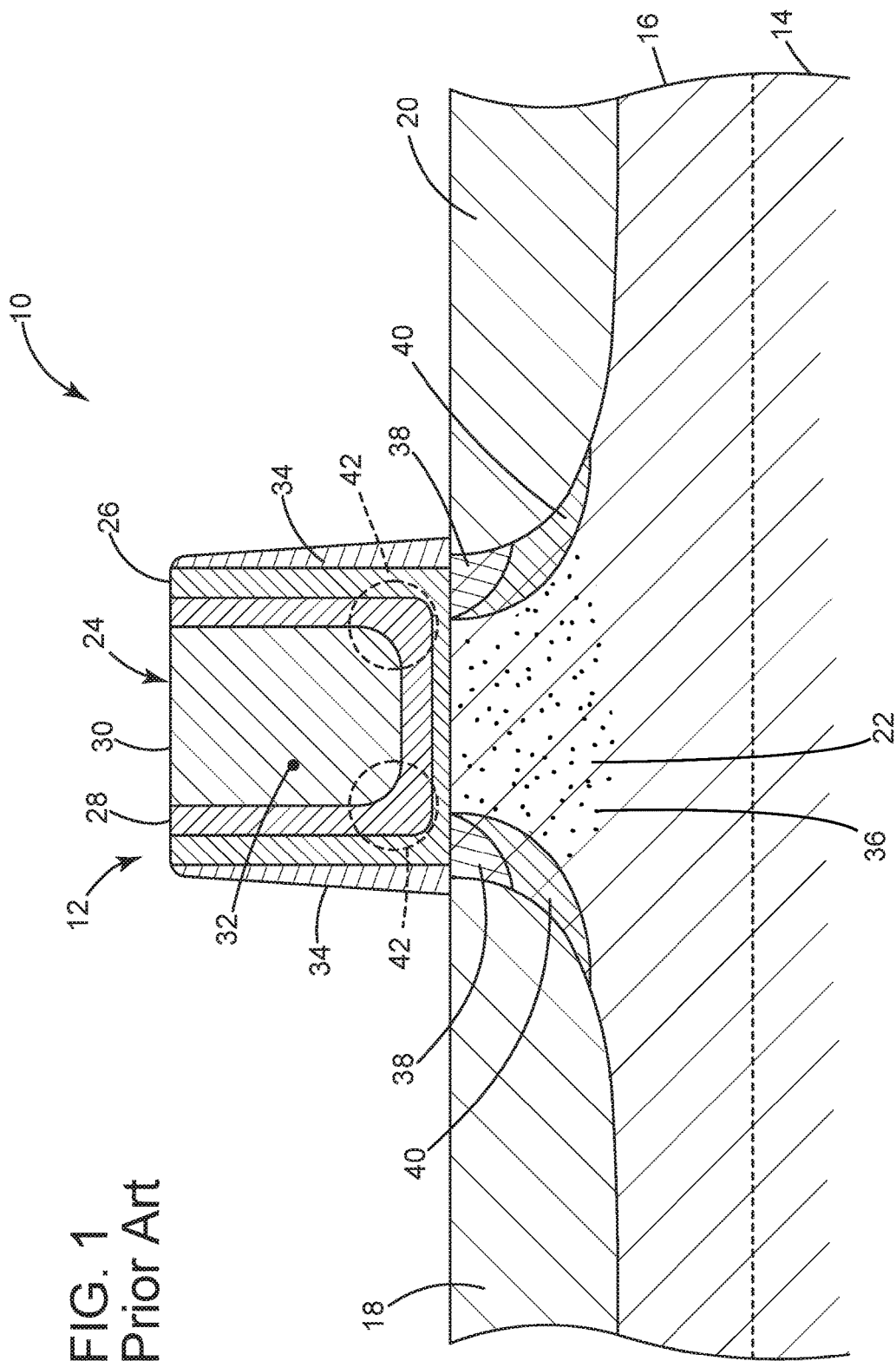
FIG. 1 is a cross-sectional view of a structure including a prior art planar n-type CMOS FET.

Referring to FIG. 1, a cross-sectional view of a structure 10 including a prior art planar n-type CMOS FET 12 is presented. Structure 10 includes a substrate 14 into which a lightly doped p-type well 16 is disposed. For this exemplary embodiment, transistor 12 is an n-type transistor and is disposed in p-well 16. However, one skilled in the art would recognize that transistor 12 could be a p-type transistor in an n-type well. Further transistor 12 could also be a finFET transistor.

Prior art transistor 12 includes a source terminal (or region) 18 and a drain terminal (or region) 20, which are connected therebetween by a channel 22. A gate stack structure 24 is disposed over the channel 22 and is operative to control electrical conductivity through the channel 22 from the source 18 to the drain 20.

The gate stack structure 24 includes a gate dielectric 26, a gate work-function metal layer 28 and a gate electrode metal 30 disposed in a gate trench 32. The gate trench 32 includes a pair of vertically extending gate spacers 34 as sidewalls and the top surface of channel 22 as the bottom of the gate trench. The gate dielectric 26 is a high k dielectric, such as Hafinum oxide and a thin interfacial oxide layer (not shown). The gate dielectric 26 can be formed over channel 22 by using a suitable deposition process or thermal oxidation process. The gate work-function metal 28 may be composed of tantalum nitride (TaN), titanium nitride (TiN) or similar. The work-function metal layer 28 can be disposed over the gate dielectric 26 by such well known processes as atomic layer deposition (ALD) or a sputtering method. Finally, the gate electrode metal 30 may be composed of tungsten, copper or similar and can be disposed over the work-function metal layer 28 by such processes as chemical or physical vapor deposition, electro-less plating or the like.

During formation, the source 18 and drain 20 regions are typically epitaxially grown with dopant (in this case an n-type dopant, such as phosphorous or arsenic). Thereafter the source 18 and drain 20 are heavily doped with the same n-type dopants through an ion implantation process. However, the implantation process is an ion bombardment that damages the crystal lattice of the source and drain. Therefore an annealing process, such as rapid thermal annealing (RTA) is required to repair the damage and activate the dopants.

Disadvantageously, the annealing process invariably induces a significant percentage of dopant ions 36 to diffuse into the channel region 22, which can randomly change the Vt of the transistor 12 and increase Vtmm between the transistor 12 and other devices in the integrated circuit.

Located adjacent to the source 18 and drain 20, and slightly overlapping the gate dielectric 26, are lightly doped drain (LDD) implants 38. LDD implants 38 are doped with the same type dopant as the source 18 and drain 20, therefore, in this exemplary embodiment, the LDD implants are lightly doped n-type. The LDD implants 38 are utilized to reduce such short channel effects (SCEs) as the hot carrier effect. The hot carrier effect is when hot carriers (e.g. electrons) in the source 18 or drain 20 gain enough energy to be injected through the gate dielectric 26 and into the work-function metal layer 28. The hot carriers that are injected as a result of the hot carrier effect can cause damage to gate structure 24. Problematically however, the formation process for such LDD implants 38, though beneficial in reducing SCEs, contribute to an increase in random diffusion of dopant ions 36 into the channel region 22, which also tends to increase Vtmm.

Located adjacent the LDD implants 38 are halo implants 40. The halo implants 40 are more heavily doped than the channel 22 with the opposite type dopant as the source 18 and drain 20. Therefore, in this exemplary embodiment, the halo implants are heavily doped p-type. The halo implants 40 are utilized to reduce unwanted punch-through leakage current across the channel 22 when the transistor 12 is in the off-state. Problematically however, the formation process for such halo implants 40, though beneficial in reducing leakage current, also contributes to an increase in random diffusion of dopant ions 36 into the channel region 22, which also tends to increase Vtmm.

Referring back to the gate work-function metal layer 28, it is important to note that, due to manufacturing limitations, the bottom corner regions (or bottom corners) 42 of the work-function metal layer 28 are not perfectly square. Rather the corner regions 42 curve away from the channel 22 and are thicker relative to the middle portion of the metal layer 28.

The overall Vt of transistor 12 is dependent, among other factors, on the effective work function of the gate stack, which includes the gate dielectric 26 and the gate work-function metal layer 28. Accordingly, the effective work function of the gate stack will change as the geometry and composition of either the gate dielectric 26 or gate work-function metal layer 28 are altered. Therefore, the overall Vt will change as the corners 42 become more variously rounded and/or thicker and, therefore, adversely increase threshold voltage mismatch (Vtmm) between transistor 12 and other devices (not shown) associated with structure 10.

Further, such rounded corners can be a major contributor to short channel effects (CSE), like the hot carrier effect, since the effective control over the channel 22 of the gate work-function metal 28 decreases as it curves away from the channel 22 in the corner regions 42. Essentially, the greater the curvature becomes in the corner regions 42, the shorter the effective length of the channel becomes, which increasingly induces such short channel effects.

Figure 6:
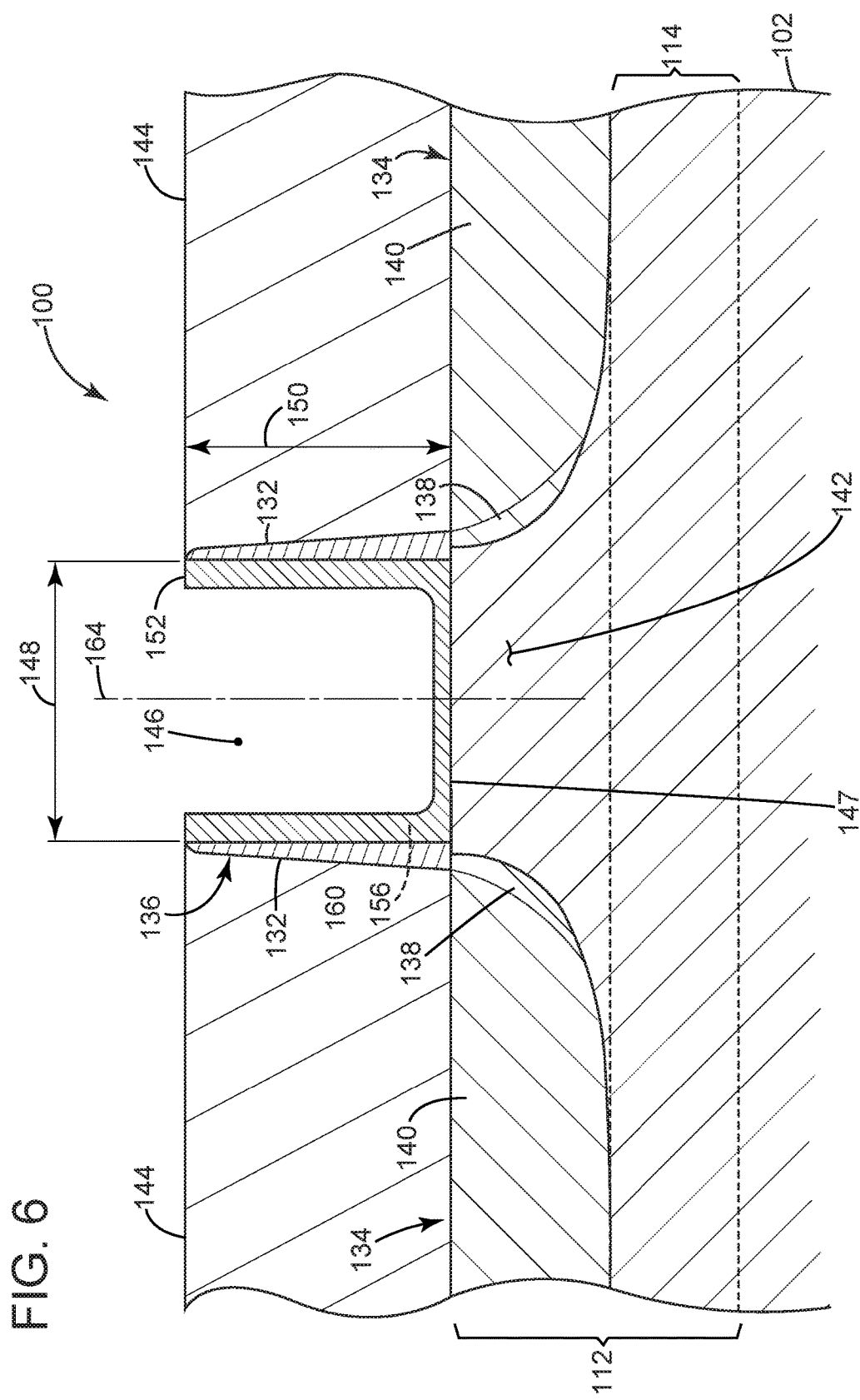
FIG. 6 is a cross sectional side view of the FinFET of FIG. 5 after the dummy gate has been removed.
Figure 7:
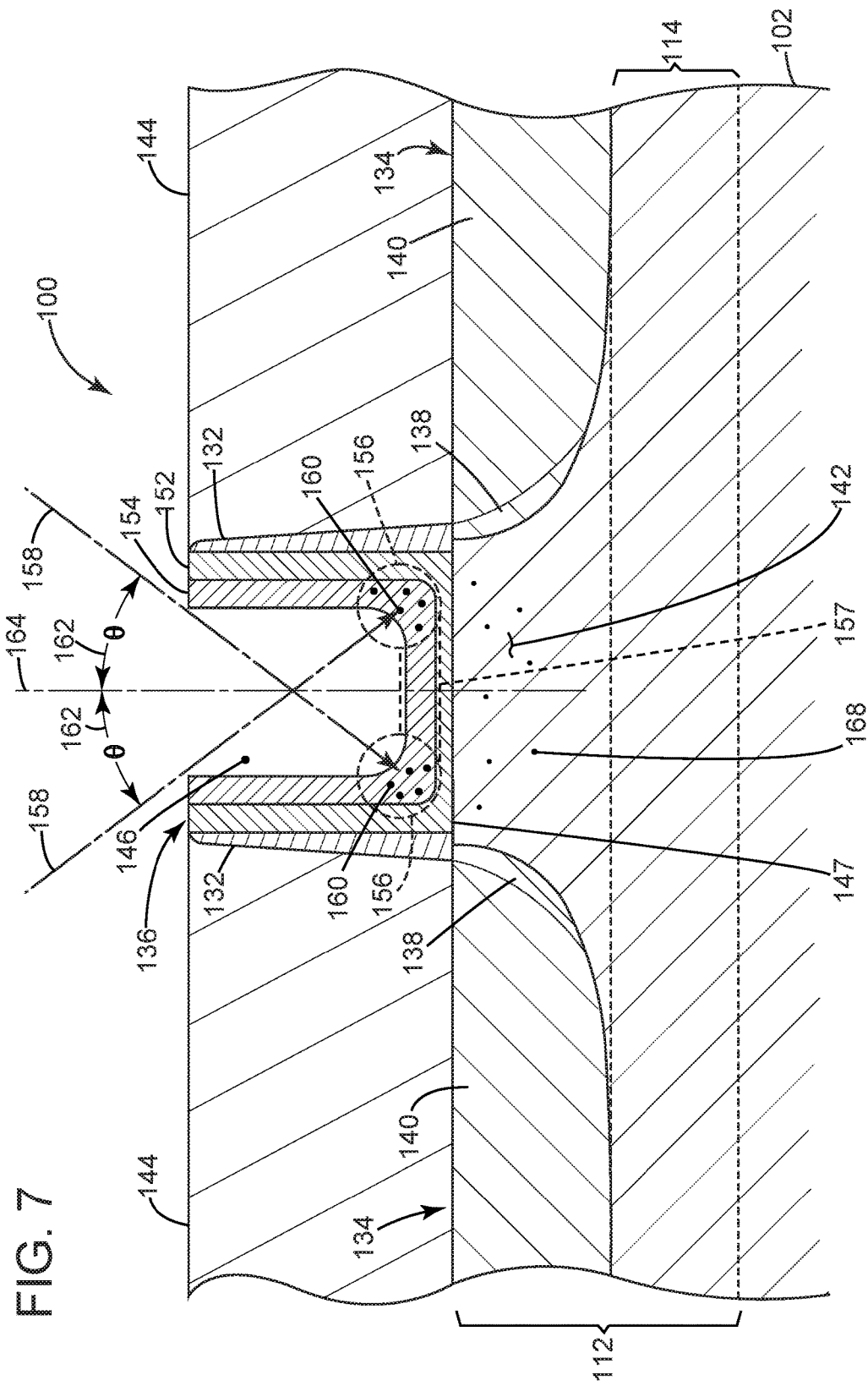
FIG. 7 is a cross sectional view of FIG. 6 after the deposition of a work-function metal layer.
Figure 8:
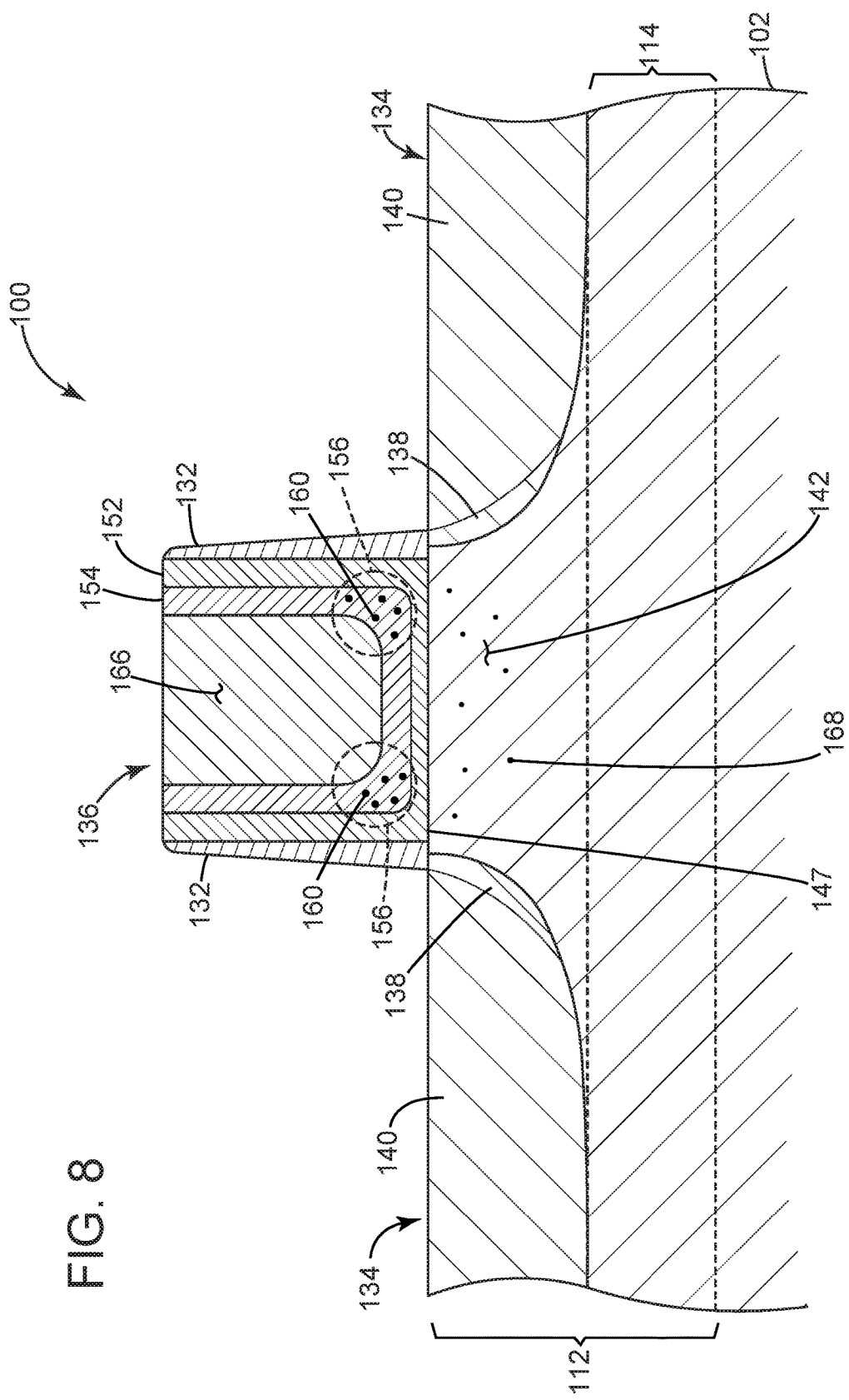
FIG. 8 is a cross sectional view of FIG. 7 after the deposition of gate electrode metal to complete the formation of the FinFET.

FIGS. 2-8 illustrate various exemplary embodiments of a FinFET and method of making the FinFet in accordance with the present invention. FIGS. 2-7 illustrate exemplary methods of making the FinFet. FIG. 8 illustrates an exemplary embodiment of the fully formed FinFet. Though a FinFet is illustrated, one skilled in the art would recognize that other transistors, such as CMOS FETs could also be made in accordance with the present invention. Such transistors could be manufactured on a bulk substrate, a silicon on insulator (SOI) substrate or the like.

Figure 2:
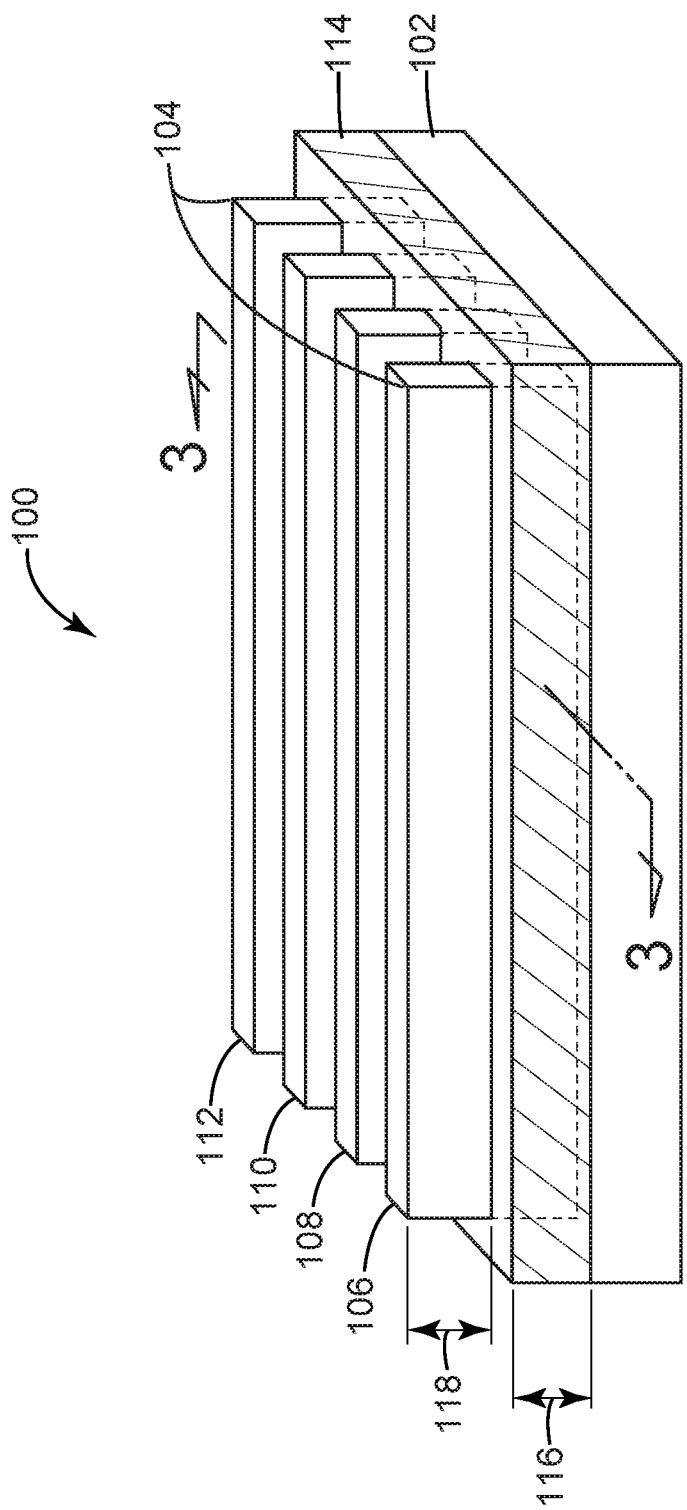
FIG. 2 is a simplified perspective view of an exemplary embodiment of a structure for an integrated circuit device in accordance with the present invention.

Referring to FIG. 2, a simplified perspective view of an exemplary embodiment of a structure 100 for an integrated circuit device in accordance with the present invention is presented at an intermediate stage of manufacturing. Structure 100 includes a p-well substrate 102 having an array 104 of fins 106, 108, 110 and 112 (i.e., 106-112) formed by well-known methods extending laterally across the substrate 102. Though illustrated as a p-well substrate, an n-well substrate could also be used. Though four fins are illustrated in array 104 for this embodiment, any number of fins may be included in the array.

A flowable oxide (FOX) layer 114 is disposed over the fins 106-112 of array 104. The FOX layer may be applied as a spin-on Si-oxide followed by an annealing process. The FOX layer is then planarized using such methods as chemical-mechanical polishing (CMP) to expose the tops of the fins.

Next the FOX layer is recessed using standard lithographic and etching processes that are well-known. The thickness 116 of the FOX layer 114 now defines an inactive region of the fins 106-112 and the exposed height 118 of the fins above the FOX layer now defines an active region of the fins.

Figure 3:
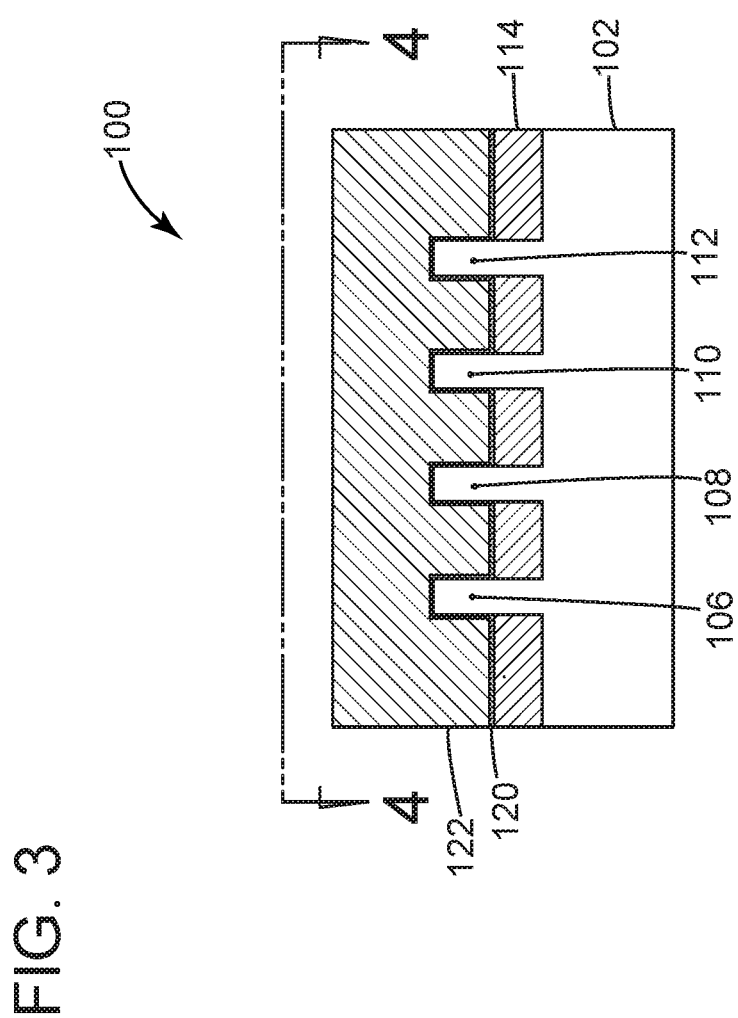
FIG. 3 is a cross sectional view of FIG. 2 taken through section line 3-3 after deposition of a dummy gate layer.

Referring to FIG. 3, a cross sectional view of FIG. 2 taken through section line 3-3 after deposition of a dummy gate layer 122 is presented. FIG. 3 includes an oxide layer 120 disposed over the structure 100. Next a dummy gate layer 122 composed of a dummy gate material, such as a poly-silicone material or similar, is disposed over the oxide layer 120. Oxide layer 120 may be formed by thermally oxidizing the exposed surface of fins 106-112, or may be deposited onto fins 106-112 using, for example, chemical vapor deposition (CVD) or atomic layer deposition (ALD). The dummy gate layer 122 is deposited over oxide layer 120 using well-known processes such as chemical vapor deposition (CVD) or the like. Following the deposition, dummy gate layer 122 can be planarized to facilitate subsequent gate formation steps, using, for example, chemical-mechanical polishing (CMP).

Figure 4:
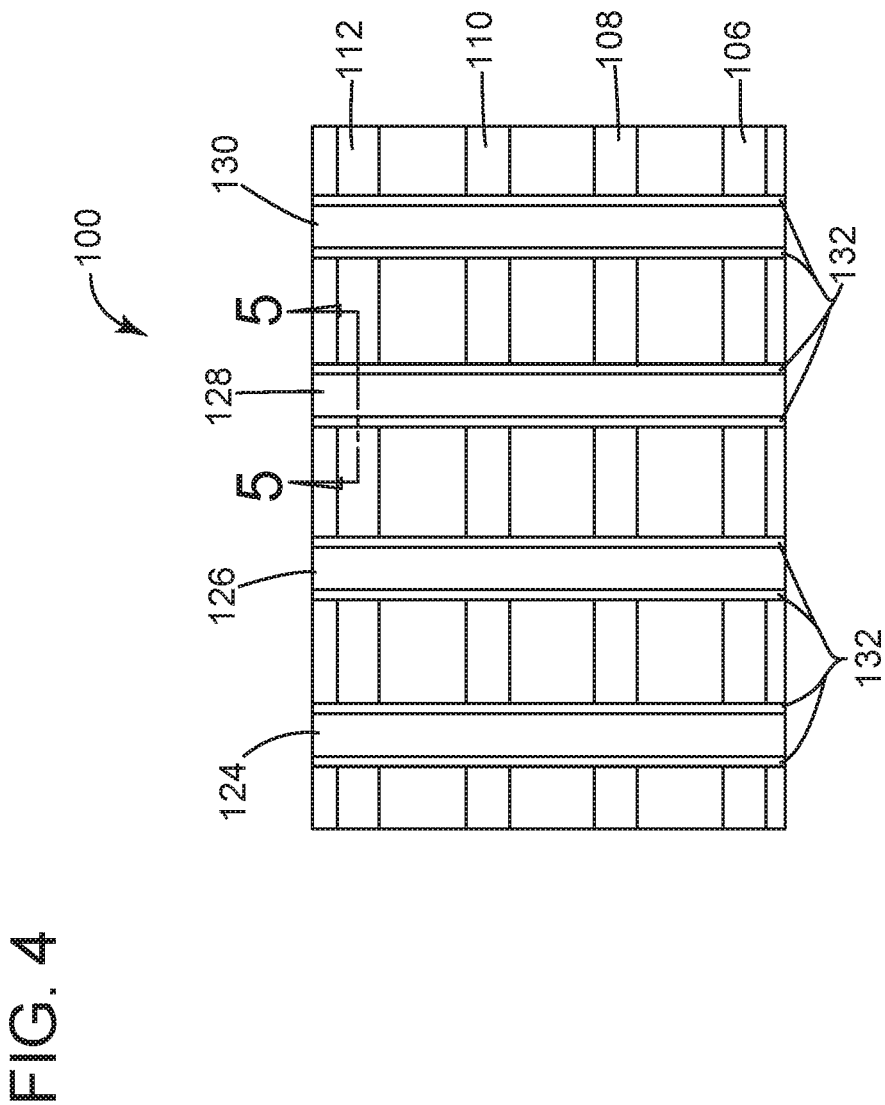
FIG. 4 is a top planar view of FIG. 3 taken through section line 4-4 after formation of dummy gates and spacers.

Referring to FIG. 4, a top planar view of FIG. 3 taken through section line 4-4 after formation of dummy gates 124, 126, 128 and 130 (i.e., 124-130) and spacers 132 is presented. Dummy gates 124-130 are created by etching the dummy gate layer 122 of FIG. 3 using well-known processes such as standard lithographic processes and anisotropic dry etching.

The spacers 132 are located on the sidewalls of the dummy gates 124-130. Spacers 132 are formed by disposing a conformal coat of spacer material, such as silicon nitride, over the patterned dummy gates 124-130 and anisotropic etching the spacer material.

Figure 5:
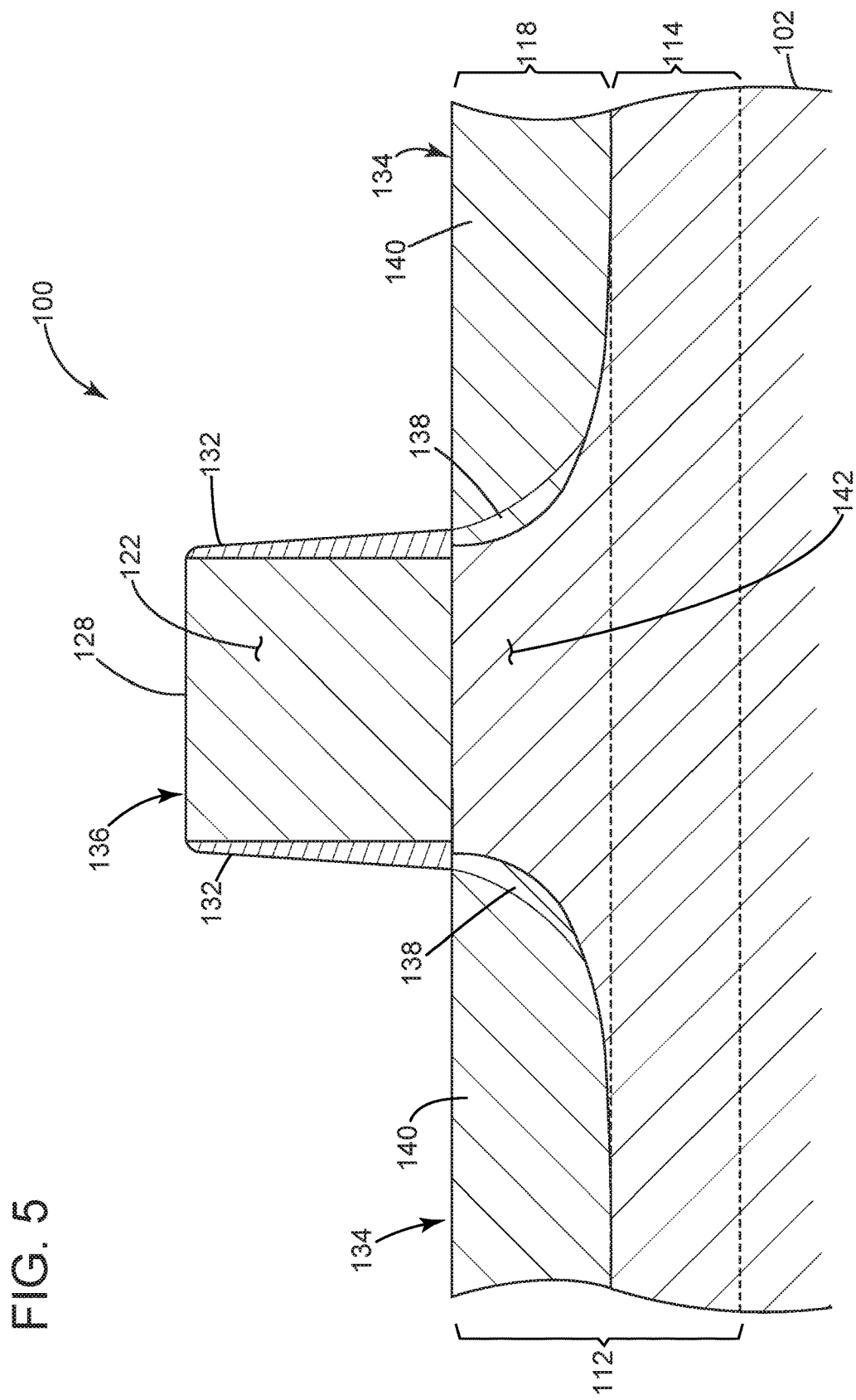
FIG. 5 is an expanded cross sectional view of a dummy gate disposed over a fin for a FinFET of FIG. 4 taken along section line 5-5.

Referring to FIG. 5, an expanded cross sectional view of dummy gate 128 disposed over fin 112 of FIG. 4 taken along section line 5-5 is presented. Dummy gate 128 includes a portion of the dummy gate layer 122 disposed between the spacers 132. After dummy gate 128 (as well as dummy gates 124, 126 and 130) and spacers 132 are formed, the upper exposed portions of fin 112 (as well as fins 106, 108 and 110) are etched down to, in this exemplary embodiment, about the FOX layer 114.

The etched down sections of fin 112 form the boundaries of source and drain (S/D) regions 134 of an n-type FinFET 136 in an intermediate stage of manufacturing. The region of fin 112 between the S/D regions 134 is the channel 142 of FinFET 136. In this exemplary embodiment, the S/D regions 134 are epitaxially grown silicon carbide (SiC) for n-type FinFET, typically grown by such methods as selective vapor-phase epitaxy (VPE), liquid phase epitaxy (LPE) or similar. For example, in this embodiment of an n-type FinFet, a VPE process containing SiC precursors may be used. Alternatively, for a p-type FinFet the precursors may be silicon germanium (SiGe).

As discussed earlier herein, prior art source region 18 and drain region 20 of CMOS FET 12 receive a light in-situ doping of n-type or p-type ions during their epitaxial growth process and thereafter are subjected to a heavy dopant implantation process. In direct contrast, the S/D regions 134 of FinFET 136 are heavily doped entirely in-situ during the epitaxial growth process and not subjected to any implantation process. In this example of an n-type FinFET 136, phosphorous or arsenic ions may be heavily doped in-situ into the epitaxially grown SiC of S/D regions 134. Alternatively, for a p-type FinFET, boron or gallium ions may be heavily doped entirely in-situ into an epitaxially grown SiGe of S/D regions 134.

By introducing dopants during the epitaxial growth process entirely in-situ, ion implantation is avoided. Advantageously, this avoids damaging the crystal lattice of S/D regions 134 by ion bombardment during the implantation process and, therefore, avoids the subsequent need to repair that lattice by additional annealing steps. As a result, random diffusion of ions into the channel 142 is suppressed and Vtmm between transistor 136 and other devices (not shown) that are associated with structure 100 is significantly reduced.

Additionally, the concentration of dopants introduced into S/D regions 134 by in-situ doping can be chosen such that LDD implants are not required. One way to do this is to use a uniform predetermined concentration of dopant atoms across the entire S/D regions 134. In that case, the concentration of in-situ dopant atoms must be high enough to promote robust current flow when the FinFET is in the on-state, but not so high as to exacerbate the short channel effects (SCEs) that the LDD implants where designed to suppress. Preferably the uniform concentration of dopant atoms in S/D regions 134 should be, for example, within a range of $10^{21}$ to $10^{22}/cm^3$.

Alternatively, in order to avoid the use of LDD implants, the concentration of in-situ doping can be dynamically varied such that a first lighter concentration of dopant is introduced during early epitaxial growth of S/D regions 134 and a second heavier concentration of dopant is introduced during later epitaxial growth of the S/D regions 134. In that case, the S/D region 134 would include a lightly doped portion 138 and a heavily doped portion 140. The lightly doped portion 138 would have a dopant concentration light enough to suppress any SCEs in the region proximate the dummy gate 128, therefore eliminating the need for any LDD implants. The heavily doped portion 140 would include the bulk of the volume (preferably greater than 80%) of the S/D regions 134 and have a dopant concentration heavy enough to enable low source/drain resistance for robust current flow when the FinFET 136 is in the on-state. Preferably the heavily doped portions 140 should have a concentration of dopant atoms, for example, within a range of $10^{21}$ to $10^{22}/cm^3$ and the lightly doped portions 138 should have a concentration of dopant atoms, for example, within a range that is 1 to 20 percent of the heavily doped portion 140.

Advantageously, by avoiding the need for LDD implants, the random diffusion of dopants into the channel region 142 is further reduced. As a result, Vtmm is also further minimized.

Referring to FIG. 6, a cross sectional side view of FinFET 136 of FIG. 5 after the dummy gate 128 has been removed is presented. Prior to removal of the dummy gate 128, an insulating dielectric layer 144, such as SiO2, was deposited over structure 100 and planarized using CMP to expose the top portion of dummy gates 124-130 (including dummy gate 128). The dummy gates 124-130 were then removed using a wet chemical etch, such as potassium hydroxide (KOH), or a dry etch such as RIE, leaving open gate trenches 146.

In the particular embodiment of FIG. 6, the gate trench 146 sidewalls include the generally vertically extending spacers 132. The gate trench 147 bottom includes the exposed portion of a top surface of channel 142 of fin 112. The gate trench 146 has an aspect ratio that is equal to the width 148 between the spacers 132 divided by the spacer height 150. Gate trench 146 also includes a vertically extending centerline 164, which extends normally from the trench bottom 147 (i.e., the top surface of channel 142) and through a center portion of the trench 146.

Once the dummy gate material, such as polysilicone, of the dummy gate 128 is removed, a gate dielectric layer 152 is then conformally coated over trench 146. The gate dielectric layer 152 is a high k dielectric and may be coated over trench 146 by such means as atomic layer deposition (ALD).

Referring to FIG. 7, a cross sectional view of FIG. 6 after the deposition of a work-function metal layer 154 is presented. The work-function metal may be a material such as titanium nitride (TiN) (for p-type work-function), titanium aluminum carbide (TiAlC) (for n-type work-function), tantalum nitride (TaN) or similar, which can be conformally deposited over the gate dielectric 152 using such processes as ALD.

It is important to note that work-function metal layer 154 has a pair of corner regions 156 proximate the trench bottom 147 that are not consistently perfectly square. Because the corner regions 156 are variously rounded, they curve away from channel 142 and tend to be thicker relative to a middle region 157 of the work-function metal layer 154. For purposes of clarity, the middle region 157 is considered herein to be that portion of the work-function metal layer 154 that is outside of the corner regions 156 and includes, at least, that portion of the work-function metal layer 154 through which vertical centerline 164 of trench 146 passes.

Due, in part, to the geometric differences between the corner regions 156 and middle region 157 of the work-function metal layer 154, the gate stack (which includes at least the gate dielectric layer 152 and the work-function metal layer 154) has an effective work function at its corner regions 156 that is potentially different from the effective work function at its middle region 157. Typically, the effective work function at the corner regions 156 is larger than the effective work function at the middle region 157. This variance in effective work function across the work-function metal layer 154 can potentially alter overall threshold voltage (Vt) of FinFET 136. Typically, the greater the increase in the effective work function in the corner regions 156 over the middle region 157, the greater will be the potential variation in the overall Vt of FET 136. Additionally, the greater the potential difference in overall Vt of FET 136 relative to other devices (not shown) associated with structure 100, the greater will be the potential Vtmm for structure 100.

In order to offset the geometric tendency within the curved corner regions 156 to alter the Vt of FinFET 136, the corner regions 156 of work-function metal layer 154 are subjected to an angled implantation process 158. The angled implantation process 158 implants any of a number of predetermined work-function tuning species 160 at a predetermined tilt angle θ 162 into the corner regions 156 in order to modify the material composition of the work-function metal 154 in those regions.

By modifying the material composition, the effective work-function of the gate stack (including at least work-function metal 154 and gate dielectric 152) in the corner regions 156 can be altered (or tuned). By tuning the effective work-function in the corner regions 156, the value of the effective work function in the corner regions 156 can be adjusted (upwards or downwards) so that the Vt at the corner is closer or slightly lower to the value of the effective work function in the middle region 157 of layer 154.

By utilizing the angled implantation process 158 to implant tuning work function species 160 into the corner regions 156 of layer 154, the effective work function across the bottom of the work-function metal layer 154 can be tuned to be substantially uniform from one corner region 156 to the other corner region 156 of the work-function metal layer 154. Essentially, the effective work function can be made substantially uniform across the entire length of the channel 142. Preferably, a substantially uniform effective work function would be to have the corner regions 156 of layer 154 tuned within 20% of the middle region 157, more preferably within 10% and most preferably within 5%.

The tilt angle θ 162 of the implantation process 158 (such as a plasma implantation process) is measured from the vertical centerline 164 of gate trench 146 and must be greater than zero. Preferably the tilt angle θ 162 should be greater than 5 degrees from vertical centerline 164, more preferably 10 degree and most preferably 15 degrees.

However, if the tilt angle θ 162 is too large, the work function tuning species will not be able to reach the targeted corner regions 156 located proximate the bottom 147 of the gate trench 146. More specifically, the smaller the width 148 (best seen in FIG. 6) between the spacers 132 relative to the spacer height 150 (best seen in FIG. 6) the smaller the tilt angle θ 162 from the vertical centerline 164 must be. As previously discussed, the gate trench 146 aspect ratio is equal to the width 148 between the spacers 132 divided by the spacer height 150. Therefore, the aspect ratio of gate trench 146 would be approximately equal to the tangent of the largest tilt angle θ that the angled species implantation process could have and still be able to implant tuning species 160 into the corner regions 156. Therefore, it is preferable that the tangent of tilt angle θ 162 be less than the aspect ratio of gate trench 146 to assure proper targeting of the corner regions 156 during the angled species implantation process 158.

The work function tuning species can be any number of elements and/or compounds that can alter the material composition of the corner regions 156 of any specific work-function metal layer 154. For example, an angled implant of nitrogen (N) can increase the effective work function of a p-type gate stack having a TiN work-function metal layer 154, and therefore achieve a lower Vt value of the p-FET using that metal layer. Additionally, for n-type gate stacks using TiN or TiAlC as a gate (n-type) work-function metal layer, additional aluminum (Al) species may be used to tune the Vt in the corner regions 156 to a lower value. Other, but not all, work function tuning species that may be used for various tuning applications are boron difluoride (BF2), lanthanum (La), hydrogen (H2) and fluorine (F).

Moreover, by tuning the corner regions 156 through the angled species implantation process 158 to provide a substantially uniform effective work function across the entire bottom of the work-function metal layer 154, better control across the entire channel 142 is established. As a result the effective channel length of channel 142 is increased. By increasing the effective channel length of channel 142, the leakage current is greatly reduced, therefore eliminating the need for any halo implants to offset that leakage current.

Referring to FIG. 8, a cross sectional view of FIG. 7 after the deposition of gate electrode metal 166 to complete the formation of FinFET 136 is presented. The gate electrode metal may be tungsten, aluminum, cobalt, copper or similar.

In this embodiment, the insulating dielectric layer 144 has also been removed by an etching process to expose the S/D regions for processing. For example, the S/D regions may now be subjected to silicide and contact formation.

The now completed FinFET 136 includes S/D regions 134 that were doped n-type (or p-type of FinFET 136 were designed to be a p-type FET) entirely in-situ during epitaxial growth of the S/D regions. Therefore any implantation processing on those regions 134 was avoided and no annealing processing was necessary. Accordingly, the number of randomly diffused dopant ions 168 has been greatly reduced over that of the prior art. In this particular embodiment, a lightly doped portion 138 and a larger by volume heavily doped portion 140 of the S/D regions 134 have been dynamically doped in-situ to eliminate the need for any LDD implants.

Further, the corner regions 156 of work function metal layer 154 has had a work function tuning species 160 implanted therein via an angled species implantation process 158. The implantation process 158 has tuned the corner regions 156 to provide a substantially uniform effective work function across the entire effective length of the channel 142 (i.e., from one corner region 156 to the other corner region 156). By doing so, Vt for FinFET 136 is better controlled and Vtmm between FinFET 136 and other devices associated with structure 100 is reduced.

Additionally, by tuning the corner regions 156, control of the channel 142 is enhanced at the corner regions, and the effective channel length is increased. As a result, leakage current is reduced, therefore the need for halo implants are eliminated. Eliminating any halo implants also reduces the concentration of randomly diffused dopant ions 168 in the channel 142, further reduces Vtmm between devices.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
 providing a substrate;
 forming a dummy gate for a transistor within a gate trench on the substrate, the gate trench including sidewalls, a trench bottom, and a trench centerline extending normally from a center portion of the trench bottom;
 removing the dummy gate from the gate trench;
 disposing a gate dielectric layer within the gate trench;

disposing a gate work-function metal layer over the gate dielectric layer, the work-function metal layer including a pair of corner regions proximate the trench bottom;

utilizing an angled implantation process to implant a work-function tuning species into the corner regions at a tilt angle relative to the trench centerline, the tilt angle being greater than zero.

2. The method of claim 1 wherein the tilt angle is greater than one of 5 degrees, 10 degrees and 15 degrees.

3. The method of claim 1 comprising:
forming the trench sidewalls from a pair of generally vertically extending spacers; and
forming the trench bottom from a top surface of a channel of the transistor, the channel disposed within the substrate;
wherein the gate trench has an aspect ratio equal to a distance between the pair of spacers divided by a height of the spacers; and
wherein the tangent of the tilt angle is less than the aspect ratio.

4. The method of claim 1 wherein the work-function metal layer includes a middle region between the pair of corner regions, the method comprising:
implanting the work-function tuning species via the angled implantation process to tune an effective work function of the corner regions to be closer in value to an effective work function of the middle region.

5. The method of claim 4 comprising:
implanting the work-function tuning species via the angled implantation process to tune the effective work function of the corner regions to be within one of 5 percent, 10 percent and 20 percent of the value of the effective work function of the middle region.

6. The method of claim 4 comprising:
implanting the work-function tuning species via the angled implantation process to tune the effective work function of the corner regions to provide a substantially uniform effective work function from one corner region to the other corner region.

7. The method of claim 1 wherein the tuning species includes one of nitrogen, aluminum, boron difluoride, lanthanum, hydrogen and fluorine.

8. The method of claim 1 comprising:
etching exposed portions of the substrate to form boundaries of a source region and a drain region, the source and drain (S/D) regions being connected by a channel disposed within the substrate, a top surface of the channel forming the trench bottom;
expitaxially growing the S/D regions from precursors; and
introducing one of an n-type dopant and a p-type dopant entirely in-situ during the epitaxial growth of the S/D regions.

9. The method of claim 8 comprising:
dynamically varying a concentration of in-situ doping during epitaxial growth to provide a lightly doped portion of the S/D regions and a heavily doped portion of the S/D regions, the heavily doped portion having a larger concentration of dopant and a larger volume than the lightly doped portion.

10. The method of claim 8 wherein the in-situ dopant is introduced into the S/D regions at a concentration that eliminates the need for lightly doped drain (LDD) implants within the transistor.

11. The method of claim 9 wherein the lightly doped portion has a concentration of dopant that eliminates the need for LDD implants within the transistor.

12. The method of claim 1 wherein the transistor is a FinFET and the substrate is a fin of the FinFET.

13. A method comprising:
providing a substrate;
etching exposed portions of the substrate to form boundaries of a source region and a drain region for a transistor, the source and drain (S/D) regions being connected by a channel disposed within the substrate;
expitaxially growing the S/D regions from precursors; and
introducing one of an n-type dopant and a p-type dopant entirely in-situ during the epitaxial growth of the S/D regions.

14. The method of claim 13 comprising:
dynamically varying a concentration of in-situ doping during epitaxial growth to provide a lightly doped portion of the S/D regions and a heavily doped portion of the S/D regions, the heavily doped portion having a larger concentration of dopant and a larger volume than the lightly doped portion.

15. The method of claim 13 wherein the in-situ dopant is introduced into the S/D regions at a concentration that eliminates the need for lightly doped drain (LDD) implants within the transistor.

16. The method of claim 14 wherein the lightly doped portion has a concentration of dopant that eliminates the need for LDD implants within the transistor.

* * * * *